United States Patent
Bucheru

(10) Patent No.: US 11,527,958 B2
(45) Date of Patent: Dec. 13, 2022

(54) THREE-SWITCH POWER CONVERTER

(71) Applicant: Apple Inc., Cupertino, CA (US)

(72) Inventor: Bogdan T. Bucheru, Austin, TX (US)

(73) Assignee: Apple Inc., Cupertino, CA (US)

( * ) Notice: Subject to any disclaimer, the term of this patent is extended or adjusted under 35 U.S.C. 154(b) by 133 days.

(21) Appl. No.: 17/025,738

(22) Filed: Sep. 18, 2020

(65) Prior Publication Data

US 2021/0384833 A1 Dec. 9, 2021

Related U.S. Application Data

(60) Provisional application No. 63/034,038, filed on Jun. 3, 2020.

(51) Int. Cl.
*H02M 3/158* (2006.01)
*G01R 19/175* (2006.01)
*G01R 19/165* (2006.01)
*H02M 1/00* (2006.01)

(52) U.S. Cl.
CPC .... *H02M 3/1584* (2013.01); *G01R 19/16538* (2013.01); *G01R 19/175* (2013.01); *H02M 1/0009* (2021.05); *H02M 1/0058* (2021.05)

(58) Field of Classification Search
None
See application file for complete search history.

(56) References Cited

U.S. PATENT DOCUMENTS

| | | | | |
|---|---|---|---|---|
| 6,989,997 B2* | 1/2006 | Xu | ................. | H02M 3/158 363/16 |
| 7,683,594 B2* | 3/2010 | Kim | ................. | H02M 1/38 323/282 |
| 9,059,636 B2* | 6/2015 | Lehn | ................. | H02M 3/335 |
| 10,177,658 B2* | 1/2019 | LaBella | ................. | H02M 1/08 |
| 10,658,928 B2* | 5/2020 | Jong | ................. | H02M 3/073 |
| 2011/0285369 A1* | 11/2011 | Cuk | ................. | H02M 3/158 323/282 |

* cited by examiner

*Primary Examiner* — Jeffrey A Gblende
(74) *Attorney, Agent, or Firm* — Fletcher Yoder PC

(57) ABSTRACT

A power converter can include a magnetic energy storage element, a main switch, a synchronous rectifier switch, and an energy recovery circuit. The energy recovery circuit can include a resonant circuit and an auxiliary switch configured to operate in conjunction with the main and synchronous rectifier switches to store energy in the resonant circuit and deliver energy therefrom to reduce switching losses associated with the main and synchronous rectifier switches. The converter can be a buck, boost, buck-boost, or other converter type. The auxiliary switch may be operated according to a two-pulse control mode or using a conventional buck converter controller with additional delay elements. The resonant circuit inductance may be a discrete inductor or a parasitic inductance, such as a PCB trace, which may be designed to provide a desired inductance value selected to efficiently provide sufficient energy to achieve reduced switching losses of the main and auxiliary switches.

17 Claims, 15 Drawing Sheets

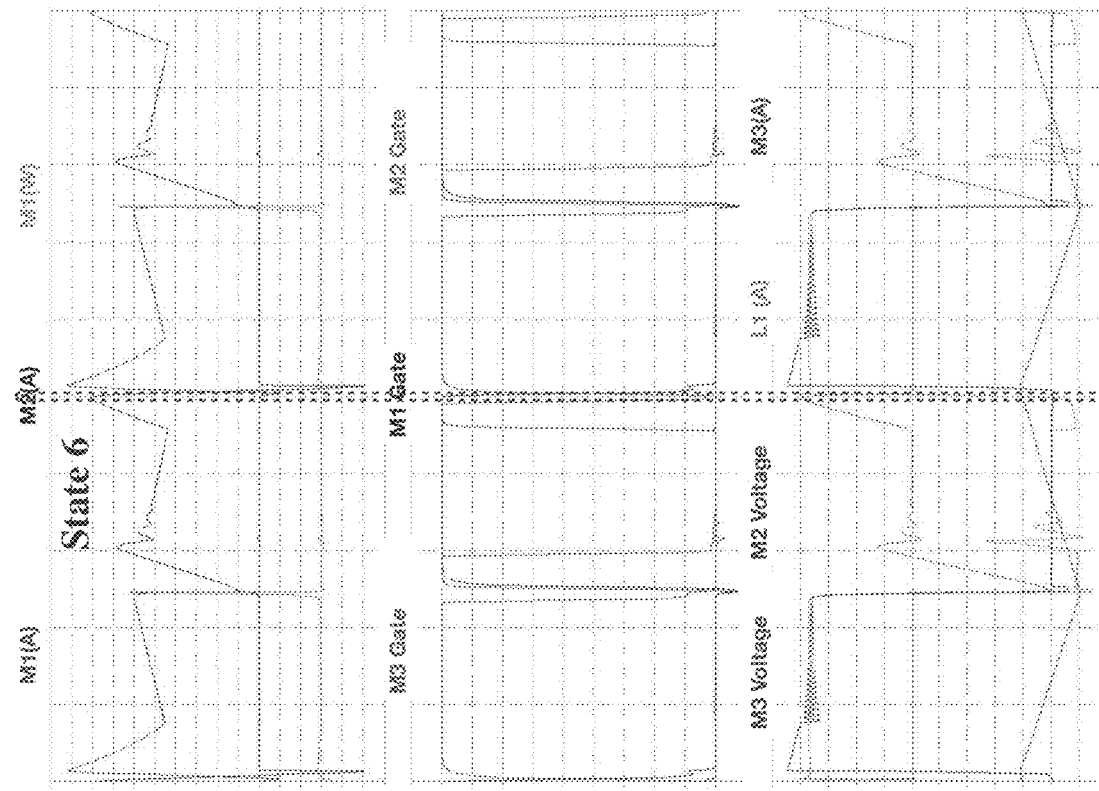
FIG. 6F1
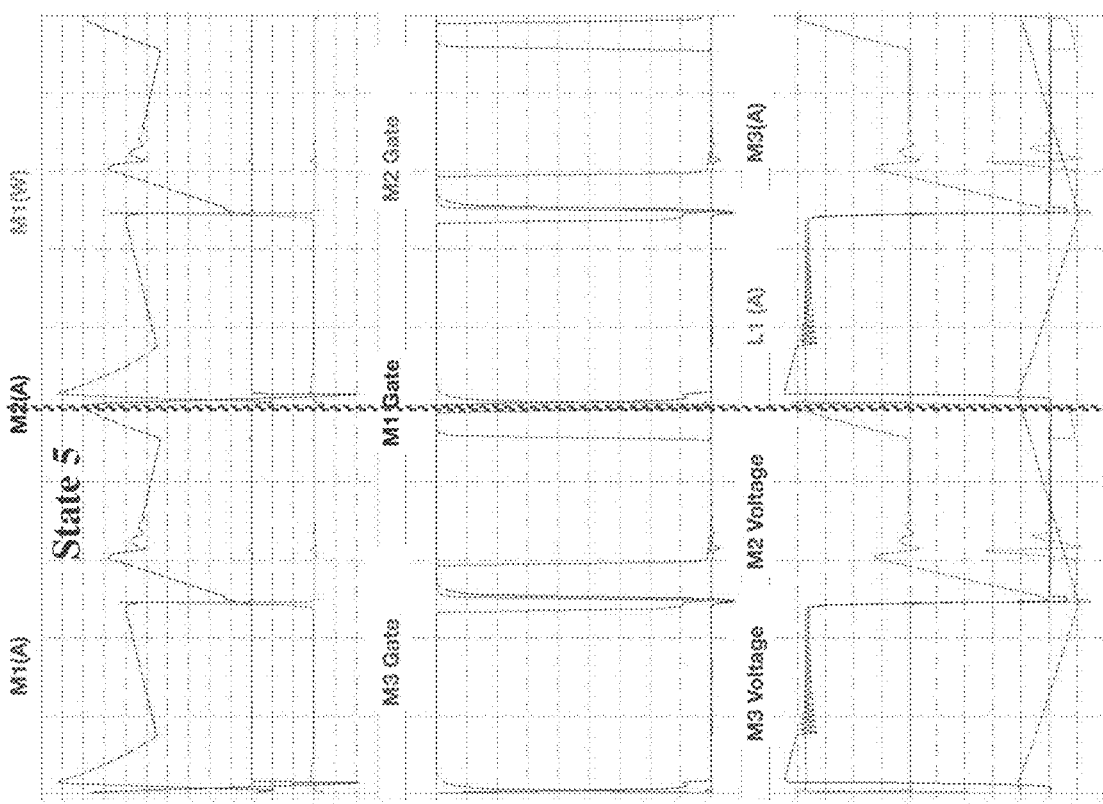
FIG. 6E1

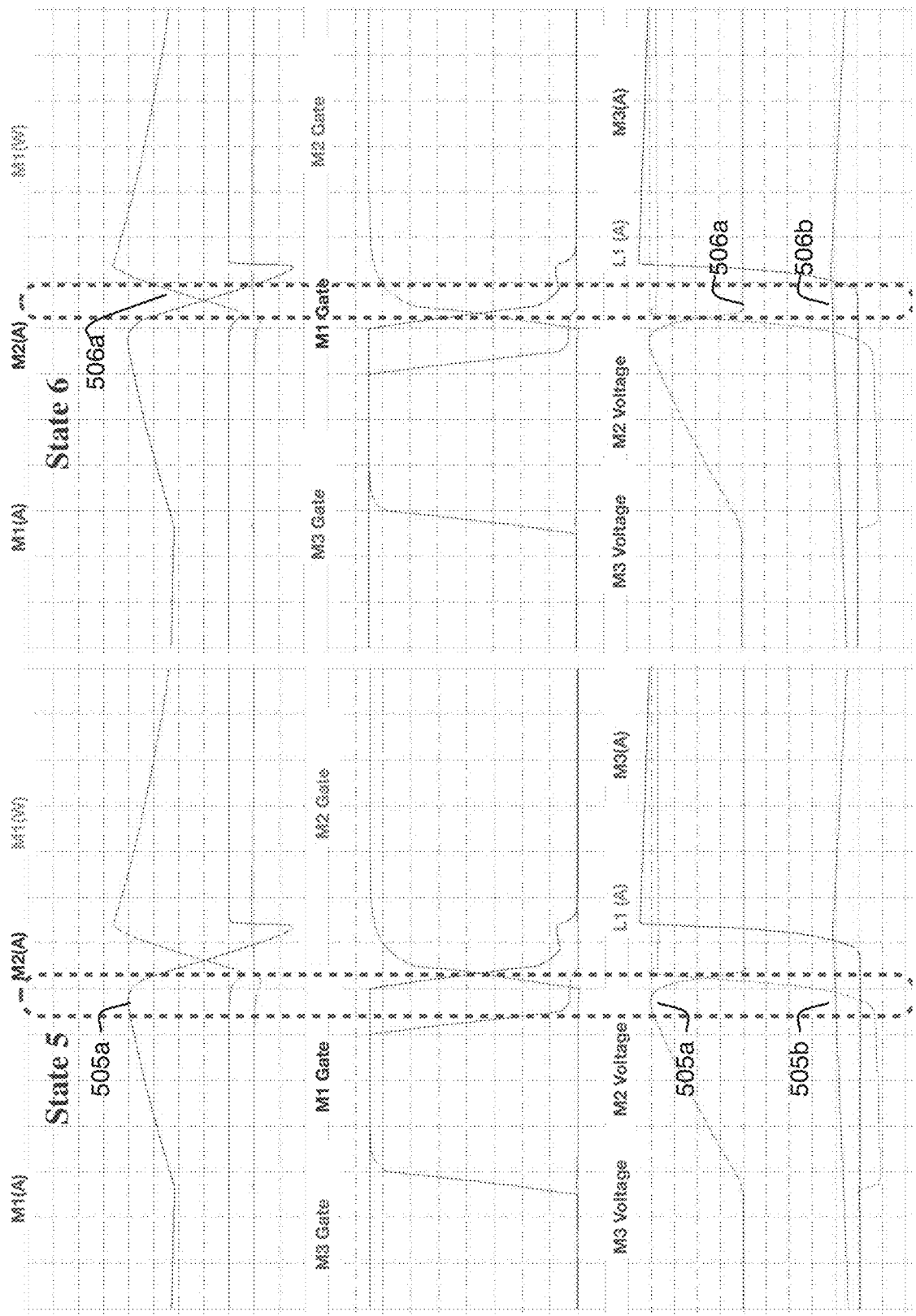
FIG. 6E2
FIG. 6F2

THREE-SWITCH POWER CONVERTER

BACKGROUND

There exist a number of DC-DC power conversion topologies and implementations, sometimes also known as switching converters. One such topology in common use is the buck converter, which converts an input DC voltage to a lower DC output voltage. Another is the boost converter, which converts an input DC voltage to a higher DC output voltage. Still another is the buck-boost converter, which converts an input DC voltage into an output DC voltage that may be higher or lower. Each of these and other converter types derived therefrom are used in a variety of applications. In general, they are based on a switching a magnetic circuit component (e.g., an inductor). More specifically, the switch is operated so that in one switch state energy is stored in the magnetic circuit element (inductor) and in the other state energy is delivered from the magnetic element to a load. There are many variations on this basic operating principle.

In some applications, such as consumer electronics, it is desirable to employ higher switching frequencies. Among other advantages, higher switching frequencies allow for lower inductance values for the magnetic circuit element (i.e., inductor), which in turn can lead to reduced physical size for the inductor and thus reduced physical size occupied in the device. One disadvantage to higher switching frequencies can be increased inefficiency of the converter due to increased switching losses.

SUMMARY

Based on the foregoing, it would be desirable to provide switching converters that can operate at higher switching frequencies.

A DC-DC power converter can include an input configured to receive an input voltage from a source and an output configured to deliver an output voltage to a load. The power converter can also include at least one magnetic energy storage element, a main switching device configured to alternate between switching states to selectively store energy from the input in the magnetic energy storage element, a synchronous rectifier switching device configured to alternate between switching states to selectively deliver energy from the magnetic energy storage element to the output, and an energy recovery circuit comprising a resonant circuit having an inductance and a capacitor and an auxiliary switching device configured to operate in conjunction with the main switching device and the synchronous rectifier switching device so as to alternately store energy in the resonant circuit and deliver energy from the resonant circuit to reduce switching losses associated with the main switching device and the synchronous rectifier switching device.

The power converter can be a buck converter, a boost converter, a buck-boost converter, or other converter type. The buck converter may be configured such that the main switching device, the inductance, and the magnetic energy storage element form a series path from the input to the output. The buck converter may further be configured such that the synchronous rectifier switching device has a first terminal coupled to a junction between the inductance and the magnetic energy storage element. The buck converter may be still further configured such that the auxiliary switching device and capacitor are coupled in series between a junction of the main switch and the inductance and a second terminal of the synchronous rectifier switch. The buck converter may also include a clamp diode coupled across the main switching device and the inductance.

The auxiliary switching device may be operated according to a two-pulse control mode. The two-pulse control mode can include turning on the main switching device, thereby storing energy in the magnetic energy storage element and an inductance of the resonant circuit. The two-pulse control mode can further include, responsive to a current through the magnetic energy storage element reaching a threshold, turning off the main switching device and turning on the auxiliary switching device and the synchronous rectifier switching device, wherein energy stored in the inductance of the resonant circuit allows zero current switching of the synchronous rectifier switch. The two-pulse control mode can further include, responsive to a current through the inductance reaching zero, turning off the auxiliary switching device, ending a first pulse, thereby transferring energy stored in the inductance of the resonant circuit to a capacitor of the resonant circuit. The two-pulse control mode can further include turning the auxiliary switching device back on, beginning a second pulse, thereby transferring energy stored in the capacitor of the resonant circuit back to the inductance. The two-pulse control mode can further include turning off the auxiliary switching device, ending the second pulse. The two-pulse control mode can further include turning on the main switching device in a zero voltage condition as a result of energy stored the inductance. The two-pulse control mode can further include turning off the synchronous rectifier switching device subsequent to the turn on of the main switching device, wherein turn off of the synchronous rectifier switching device is a zero current switching event as a result of energy stored in the inductance.

The power converter can alternatively be operated such that the auxiliary switching device is operated using a synchronous rectifier control output of a conventional buck converter controller and wherein the synchronous rectifier switching device is operated using a synchronous rectifier control output of a conventional buck converter controller with a predetermined delay.

The magnetic energy storage element of the power converter may an inductor. The resonant circuit inductance may be a discrete inductor or a parasitic inductance, such as a parasitic inductance of the PCB trace. The parasitic inductance may be designed to provide a desired inductance value selected to provide sufficient energy to achieve reduced switching devices of the main switching device and the auxiliary switching device without circulating excess energy in the circuit.

A two-pulse control mode for a converter as described above can include turning on the main switching device, thereby storing energy in the magnetic energy storage element and an inductance of the resonant circuit. The two pulse control method can further include, responsive to a current through the magnetic energy storage element reaching a threshold, turning off the main switching device and turning on the auxiliary switching device and the synchronous rectifier switching device, wherein energy stored in the inductance of the resonant circuit allows zero current switching of the synchronous rectifier switch. The two pulse control method can further include, responsive to a current through the inductance reaching zero, turning off the auxiliary switching device, ending a first pulse, thereby transferring energy stored in the inductance of the resonant circuit to a capacitor of the resonant circuit. The two pulse control method can further include turning the auxiliary switching device back on, beginning a second pulse, thereby transferring energy stored in the capacitor of the resonant circuit back to the inductance. Turning the auxiliary switching device back on may be responsive to a current through the magnetic storage element reaching a threshold. The two pulse control method can further include turning off the auxiliary switching device, ending the second pulse. Turning off the auxiliary switching device may be responsive to a voltage across the capacitor reaching zero. The two pulse control method can further include turning on the main switching device in a zero voltage condition as a result of energy stored the inductance. The two pulse control method can further include turning off the synchronous rectifier switching device subsequent to the turn on of the main switching device, wherein turn off of the synchronous rectifier switching device is a zero current switching event as a result of energy stored in the inductance.

An alternative control mode for a power converter as described above can include turning on the main switching device, thereby storing energy in the magnetic energy storage element and an inductance of the resonant circuit. The control mode can further include, responsive to a current through the magnetic energy storage element reaching a threshold, turning off the main switching device and turning on the auxiliary switching device, thereby beginning transfer of energy stored in the inductance to a capacitor of the resonant circuit. The control mode can further include after a first delay, turning on the synchronous rectifier switching device in a zero current switching condition as a result of energy stored in the inductance of the resonant circuit. The control mode can further include turning off the auxiliary switching device commencing a second delay period. The control mode can further include, during the second delay period, turning on the main switching device in zero voltage condition as a result of energy stored in the resonant circuit, at the end of the second delay period, turning off the synchronous rectifier switch.

BRIEF DESCRIPTION OF THE DRAWINGS

FIGS. 6A-6G depict various waveforms in various switching states of the three switch buck converter implementing a second control scheme.

DETAILED DESCRIPTION

Figure 1:
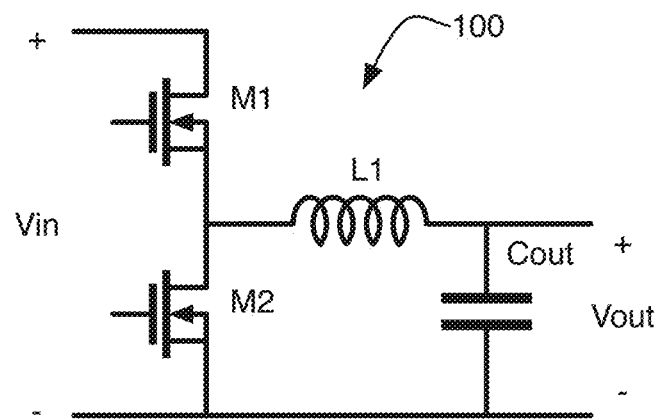
FIG. 1 depicts a schematic of an exemplary buck converter.

In the following description, for purposes of explanation, numerous specific details are set forth to provide a thorough understanding of the disclosed concepts. As part of this description, some of this disclosure's drawings represent structures and devices in block diagram form for sake of simplicity. In the interest of clarity, not all features of an actual implementation are described in this disclosure. Moreover, the language used in this disclosure has been selected for readability and instructional purposes, has not been selected to delineate or circumscribe the disclosed subject matter. Rather the appended claims are intended for such purpose.

Various embodiments of the disclosed concepts are illustrated by way of example and not by way of limitation in the accompanying drawings in which like references indicate similar elements. For simplicity and clarity of illustration, where appropriate, reference numerals have been repeated among the different figures to indicate corresponding or analogous elements. In addition, numerous specific details are set forth in order to provide a thorough understanding of the implementations described herein. In other instances, methods, procedures and components have not been described in detail so as not to obscure the related relevant function being described. References to "an," "one," or "another" embodiment in this disclosure are not necessarily to the same or different embodiment, and they mean at least one. A given figure may be used to illustrate the features of more than one embodiment, or more than one species of the disclosure, and not all elements in the figure may be required for a given embodiment or species. A reference number, when provided in a given drawing, refers to the same element throughout the several drawings, though it may not be repeated in every drawing. The drawings are not to scale unless otherwise indicated, and the proportions of certain parts may be exaggerated to better illustrate details and features of the present disclosure.

FIG. 1 depicts a schematic of a conventional buck converter 100 that converts an input DC voltage Vin to an output DC voltage Vout that is lower than Vin. Buck converter 100 includes a main switch M1, a buck inductor L1, a synchronous rectifier switch M2, and an output filter capacitor Cout. In some embodiments, synchronous rectifier switch M2 may be replaced with a simple rectifier, such as a diode, although synchronous rectifiers are often used for increased operating efficiency.

During a first switching stage, M1 is closed (turned on), which allows current to flow from the input, through inductor L1, to a load connected to the output. This current stores energy in the buck inductor L1. After some period of time, M1 may be opened (turned off) initiating a second switching stage. However, because the energy stored in buck inductor L1 cannot dissipate instantaneously, the current through buck inductor L1 cannot change instantaneously. Thus the inductor current continues to circulate through a load connected to the output (and the output capacitor), returning to buck inductor L1 through synchronous rectifier switch M2. This circulating current discharges the energy stored in buck inductor L1. The initial current flow through M2 may be through an intrinsic body diode of synchronous rectifier switch M2, which can allow synchronous rectifier switch M2 to be turned on in a zero voltage condition, reducing switching losses. After some period of time, M2 may be opened (turned off), and M1 may be closed (turned on) again, repeating the cycle.

The on and off time periods for the respective switching devices may be controlled according to a variety of control schemes so as to regulate the output voltage and/or output current. Additionally, there are various modes of operation that may be used, typically defined by the current through buck inductor L1. In a discontinuous conduction mode (DCM), the current through the inductor ramps up from zero during the first switching state, ramps back down to zero during the second switching state, and remains at zero for some period of time before reverting to the first switching state. In a continuous conduction mode (CCM), the current through the inductor ramps up from a non-zero minimum value during the first switching state and ramps down to a non-zero minimum value during the second switching state, always remaining positive. In a critical conduction mode (CrCM), the inductor current ramps up from zero during the first switching state, ramps back down to zero during the second switching state, which immediately triggers a return to the first switching state. In other words, in the critical conduction mode, the inductor current does not remain at zero for any significant period of time. The foregoing is a basic description of the structure and operation of a buck converter. Many variations and additional details may be incorporated into any particular implementation.

Figure 2:
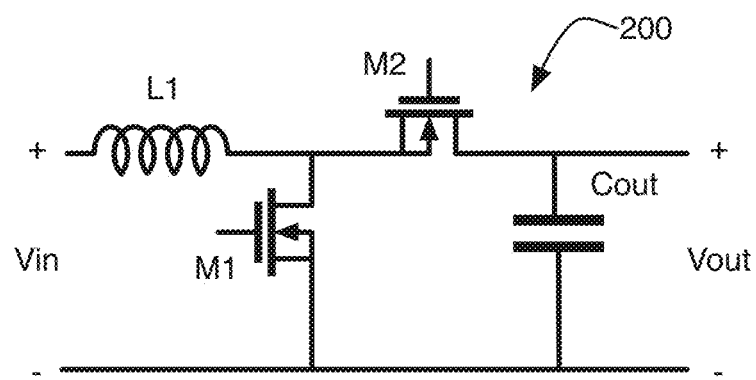
FIG. 2 depicts a schematic of an exemplary boost converter.

FIG. 2 depicts a schematic of a conventional boost converter 200 that converts an input DC voltage Vin to an output DC voltage Vout that is higher than Vin. Boost converter 200 includes a main switch M1, a boost inductor L1, a synchronous rectifier switch M2, and an output filter capacitor Cout. In some embodiments, synchronous rectifier switch M2 may be replaced with a simple rectifier, such as a diode, although synchronous rectifiers are often used for increased operating efficiency.

During a first switching stage, M1 is closed (turned on), which allows current to flow from the input through boost inductor L1 and back to the input, which stores energy in boost inductor L1. During this switching stage energy is not delivered from input to load, but rather from output filter capacitor Cout to the load. After some period of time, M1 may be opened (turned off) initiating a second switching stage. However, because the energy stored in boost inductor L1 cannot dissipate instantaneously, the current through buck inductor L1 cannot change instantaneously. Thus the inductor current circulates through synchronous rectifier switch M2 to a load connected to the output (and the output capacitor), returning to boost inductor L1 through the input. This circulating current discharges the energy stored in boost inductor L1. The initial current flow through M2 may be through an intrinsic body diode of synchronous rectifier switch M2, which can allow synchronous rectifier switch M2 to be turned on in a zero voltage condition, reducing switching losses. After some period of time, M2 may be opened (turned off), and M1 may be closed (turned on) again, repeating the cycle.

As with the buck converter described above, boost converter 200 may be operated using various control schemes and modes to provide the desired output voltage and or current at the output. These details are not repeated here. Many variations and additional details may be incorporated into any particular implementation.

There are other converter types, such as the buck-boost converter and other derivative converter types that operate according to the general principles described above. The following description of a three switch buck converter includes concepts that may similarly be applied to boost converters, buck converters, buck-boost converters, and the other derivative converter types.

FIG. 300 depicts a basic three switch buck converter 300. Three switch buck converter 300 incorporates conventional buck converter components, including main switch M1, synchronous rectifier switch M2, buck inductor Lbuck, and output filter capacitor Cout, which correspond to their counterparts described above with respect to FIG. 1. Three switch buck converter also incorporates three additional components: auxiliary switch M3, capacitor Cr, and inductor/inductance Ls, which may be used to modify the operation of buck converter 300 as described in greater detail below. In short, these additional components operate as a sort of energy recovery circuit that may be used to achieve various zero voltage switching and zero current switching events of the main switch M1 and the synchronous rectifier switch M2 as described in greater detail below. FIG. 400 depicts an alternative three switch buck converter 400 that includes an optional additional clamp diode Dclamp and an optional bleed resistor Rbleed, each connected as shown. Clamp diode Dclamp may be provided to minimize transient ringing events associated with the various switching operations, and bleed resistor Rbleed may be provided to keep excess charge from accumulating on capacitor Cr.

Because the additional components described above effectively act as a quasi-parasitic energy storage and recovery circuit, they may be physically relatively small as compared to the other circuit components (which handle the full power of the circuit). Thus, their incorporation into a particular embodiment may have little if any impact on the required circuit area and/or volume. For example, in some embodiments, inductor Ls may have a relatively small inductance compared to buck inductor Lbuck. In fact, in some embodiments, inductor Ls may be a parasitic inductance associated with, for example, a printed circuit board trace, and thus may not be a discrete physical component at all. The inductance value of Ls may be selected so as to be large enough ensure sufficient energy storage and recovery to achieve the soft switching events described below, while being small enough to minimize the amount of energy circulating due to its presence. Similarly, capacitor Cr may have a relatively small value, for example as compared to output filter capacitor Cout. Likewise, because auxiliary switch M3 may have lower voltage and/or current ratings than switches M1 and M2, and may thus be a physically smaller device.

Figures 6A, 6B:
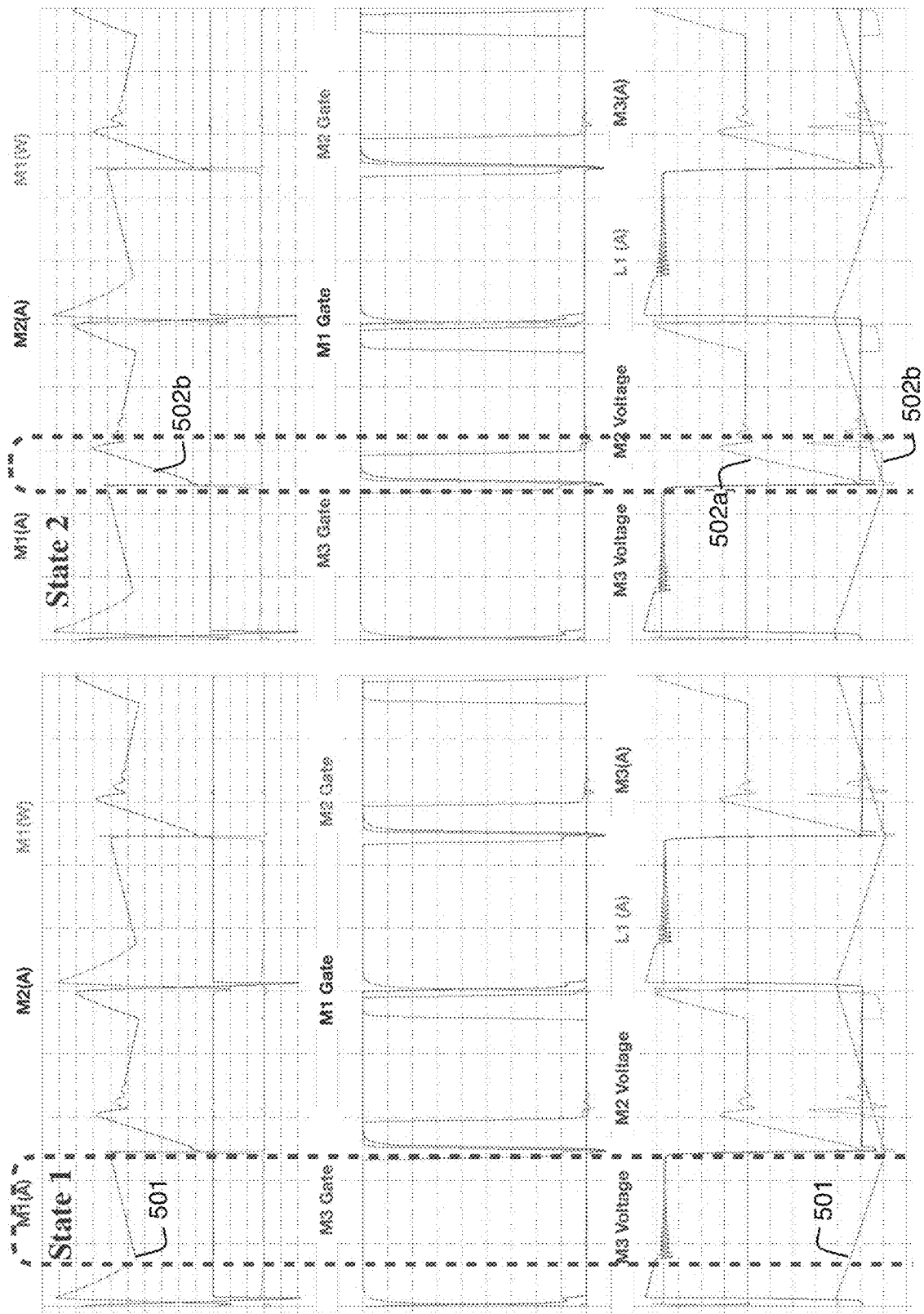
Figure 6D:
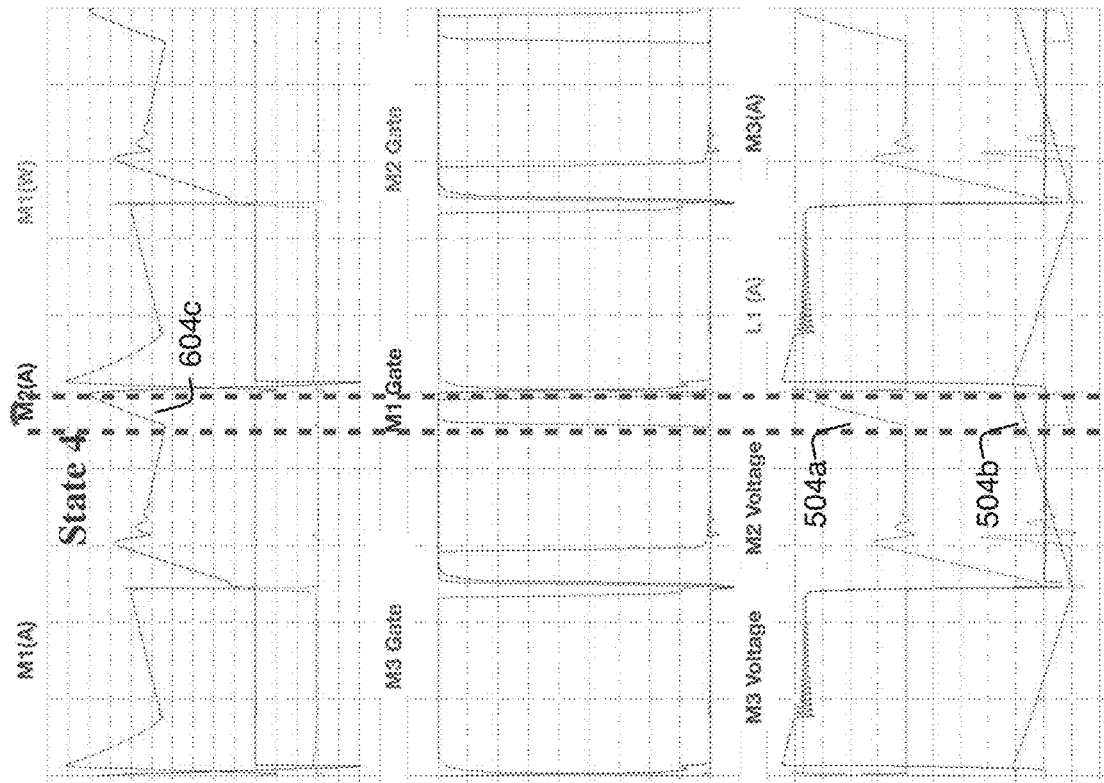
Figure 6C:
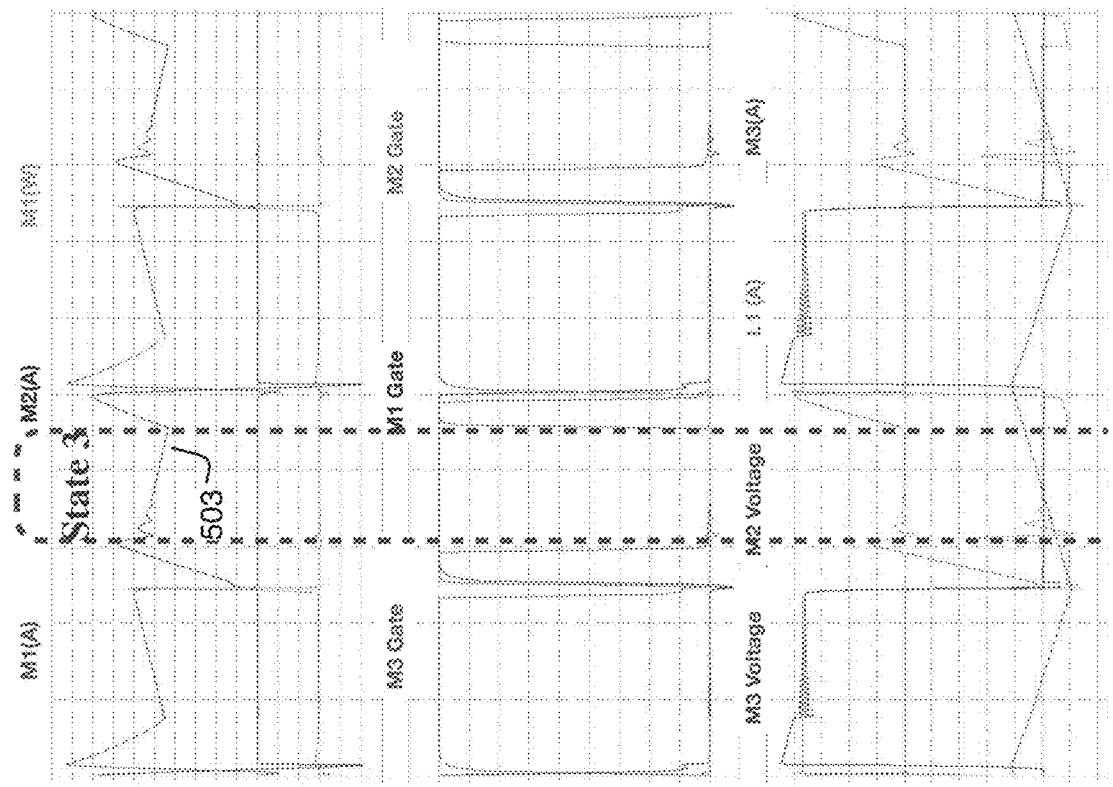
Figure 6G:
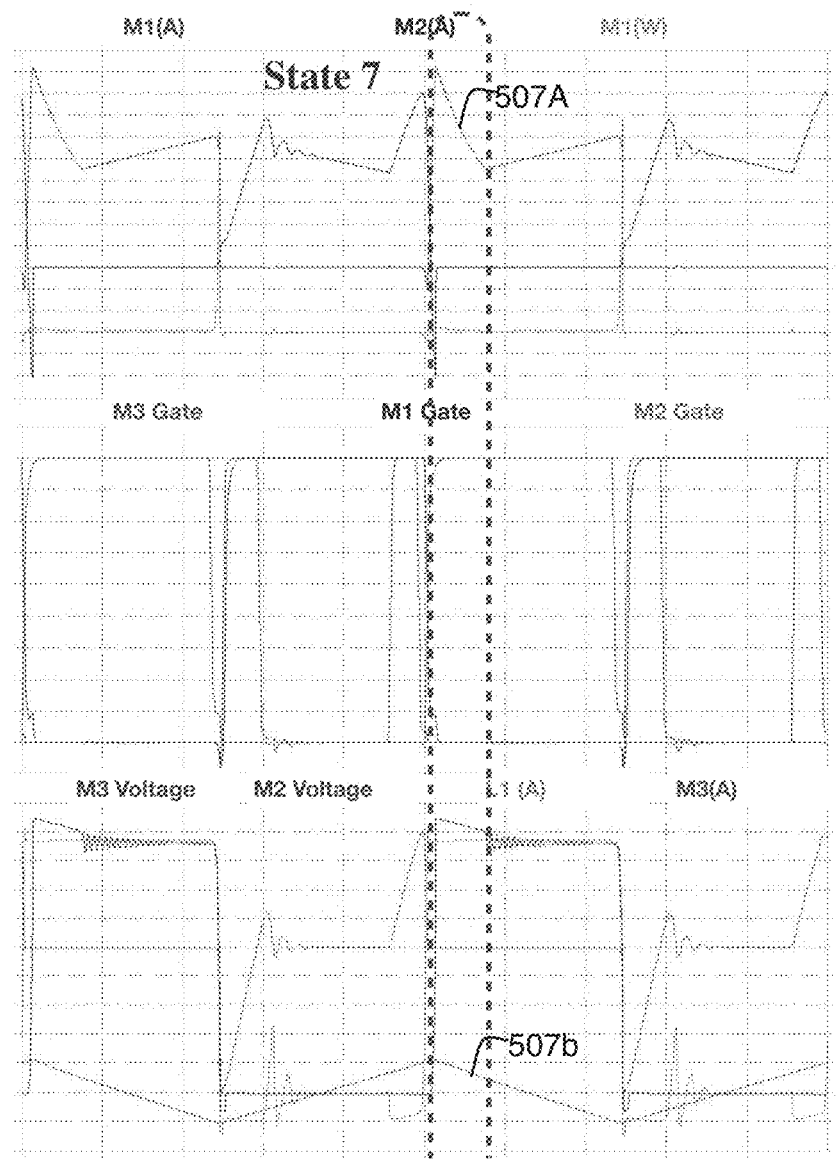
Figure 7:
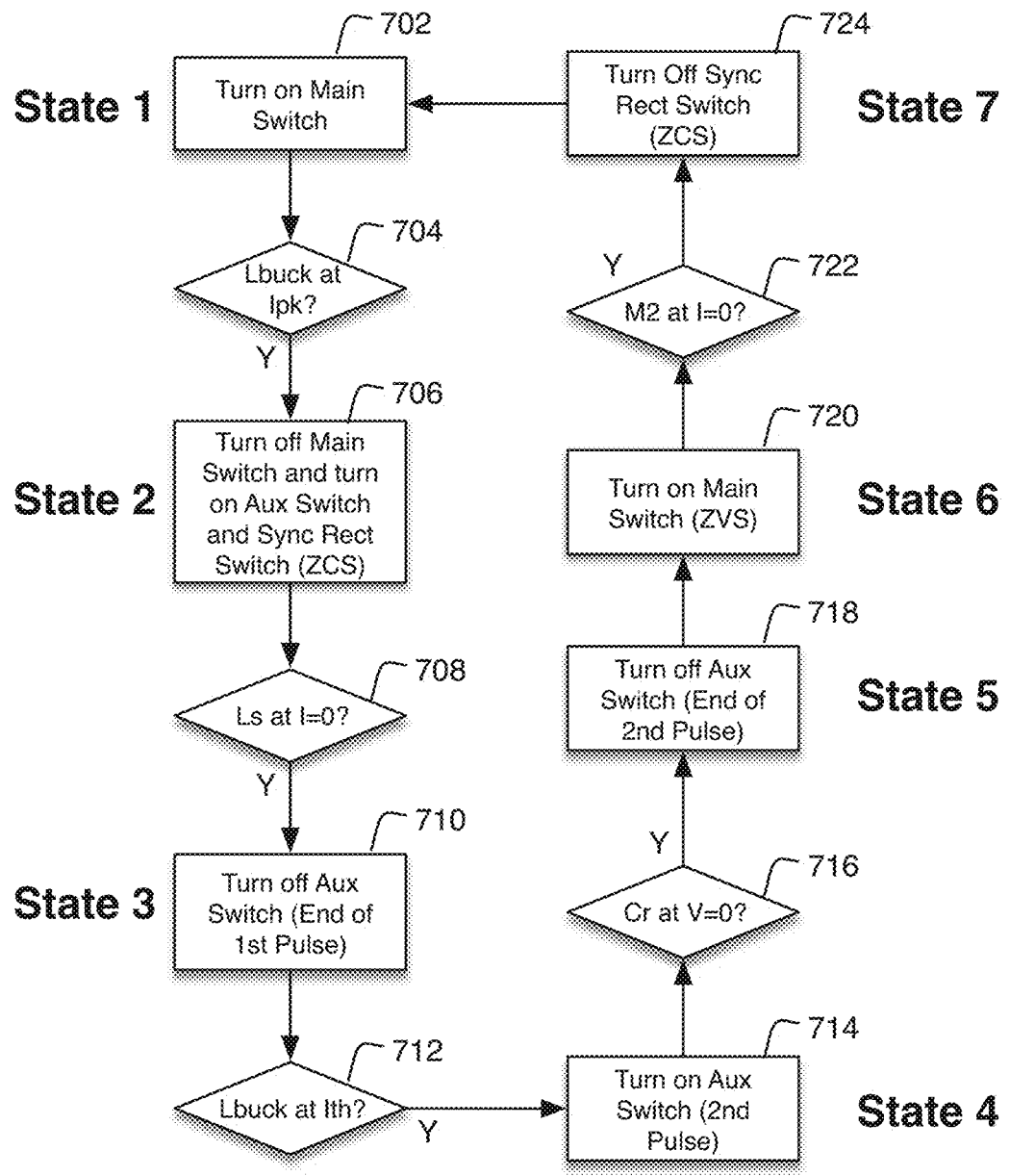
FIG. 7 is a block diagram depicting a first control scheme for a three switch buck converter.
Figure 9:
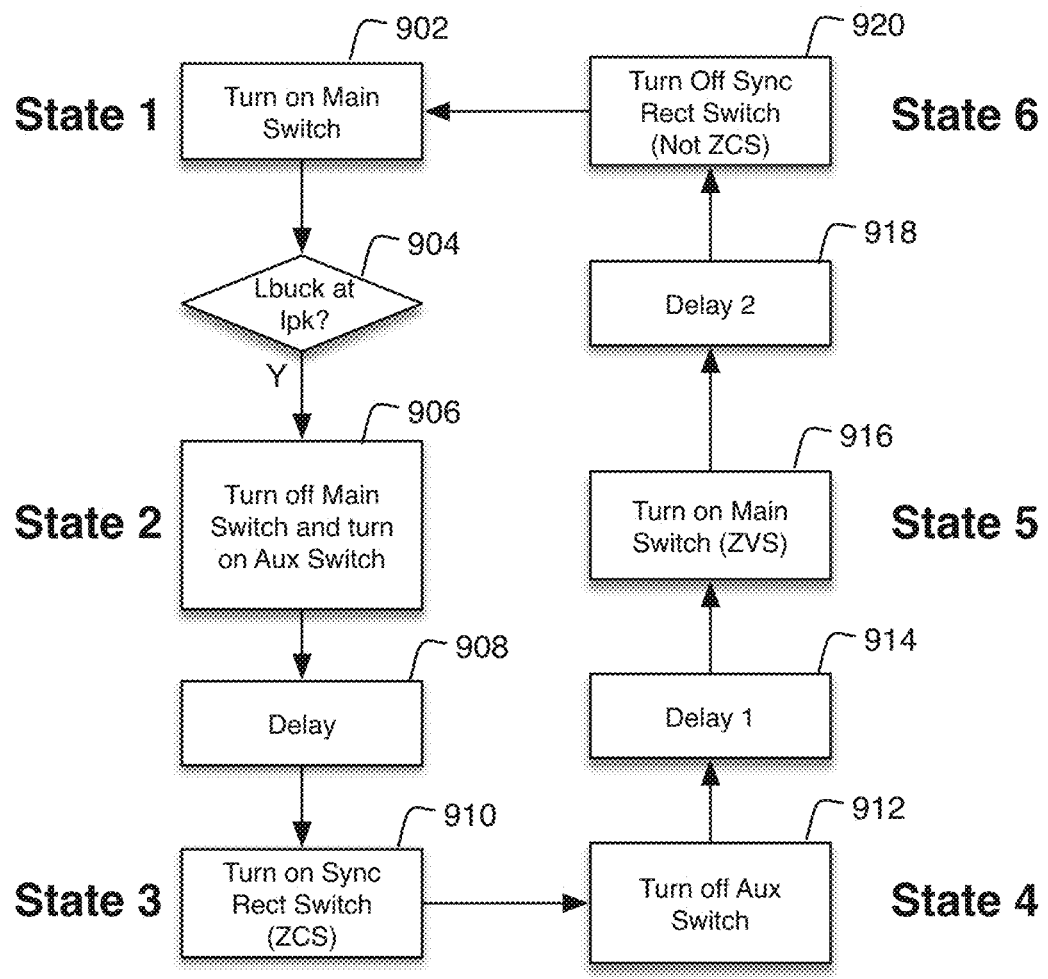
FIG. 9 is a block diagram depicting a first control scheme for a three switch buck converter.

Three switch buck converter may be operated according to various control modes. An exemplary first control mode is depicted in FIG. 7, which is described in greater detail below. This first control mode includes seven operating states, which are described below with reference to FIGS. 5A-5G, which depict the current flows through an exemplary circuit embodiment in the respective states, and FIGS. 6A-6G, which depict various voltage and current waveforms for the respective states. A second control mode is depicted in FIG. 9, which is also described in greater detail below. The first control mode may be more complex to implement, but may have an efficiency advantage versus the second control scheme, which may be simpler to implement at the potential cost of slightly reduced efficiency.

First Control Mode—Two Pulse Auxiliary Switch

Figure 5A:
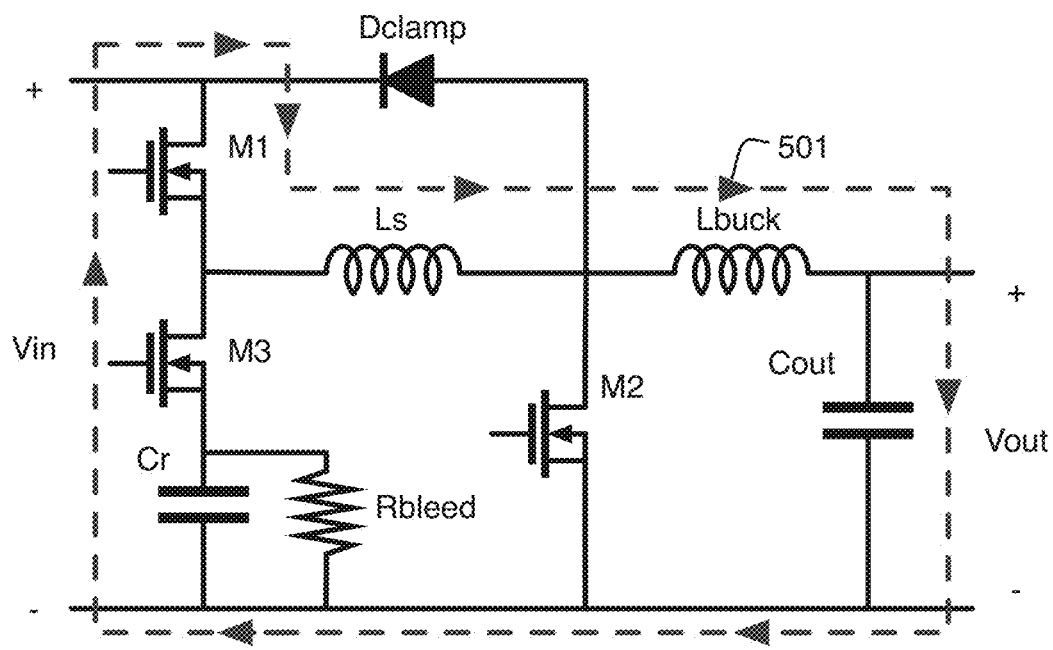
FIGS. 5A-5G depict current paths in various switching states of the three switch buck converter implementing a first control scheme.
Figure 5B:
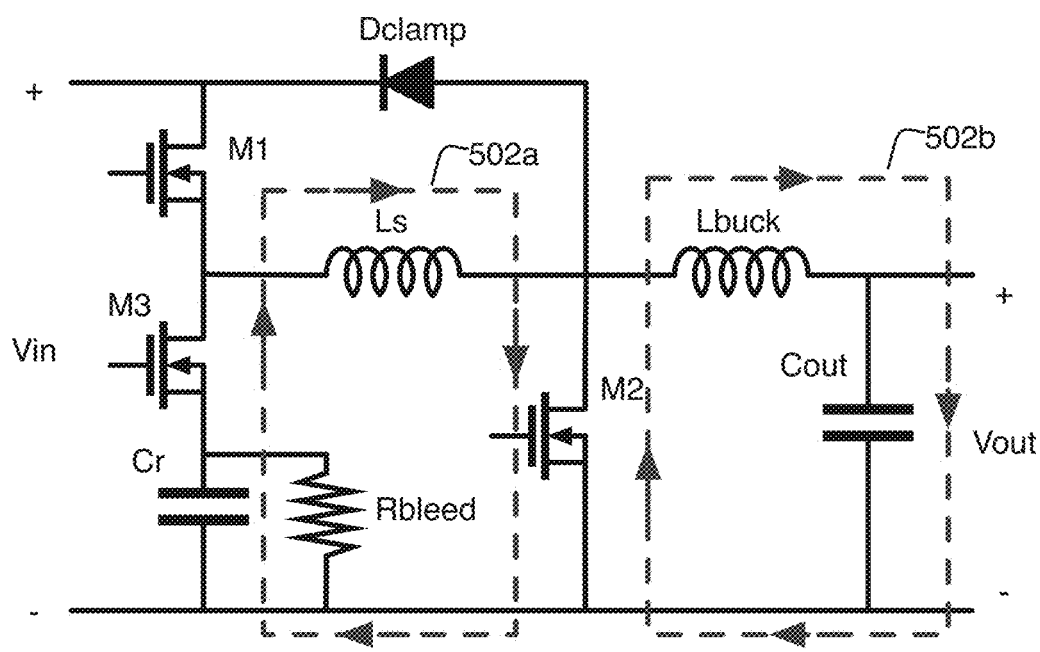
Figure 5G:
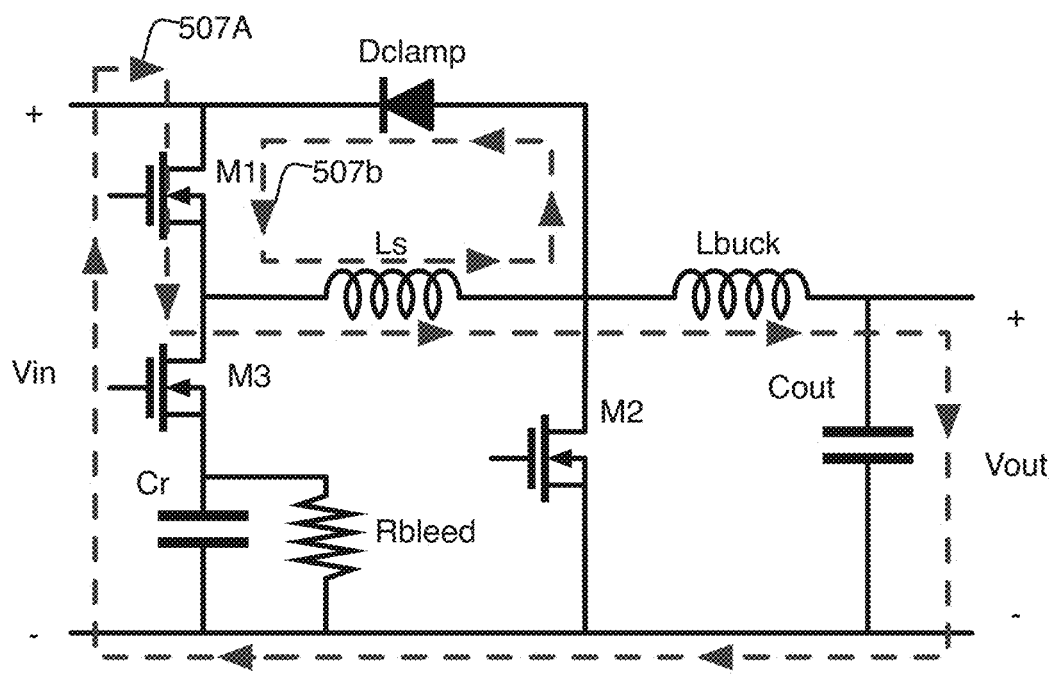

Turning now to FIG. 5A, a current flow through an exemplary three switch buck converter in a first state (State 1) of a first control mode is depicted. This first switching state corresponds to the first switching state of a conventional buck converter, as was described above with respect to FIG. 1. More specifically, in State 1 main switch M1 is closed/turned on. As described in greater detail below with respect to FIG. 5G, this turn on transition may be a zero voltage switching (ZVS) event, leading to increased operating efficiency. Additionally, synchronous rectifier switch M2 and auxiliary switch M3 are open/turned off. (As noted above, switch M2 could also be a simple rectifier, such as a diode.) During State 1, current 501 flows along the indicated path. This current flows in series through inductor/inductance Ls and also through buck inductor Ls to a load connected to the circuit output. This current will ramp up substantially linearly, as depicted in FIG. 6A. (Current L1(A) in FIGS. 6A-6G is depicted as the negative of the current through the boost inductor, and thus the described current increase is depicted as becoming more negative.) Current 501 is also the current through main switch M1. The result of this current 501 is that energy is stored in buck inductor Lbuck and in additional inductor/inductance Ls. At all times during State 1, and particularly at the end of State 1, the current through both inductors is the same.

At a time determined by the controller in accordance with the particulars of the design, switch M1 is turned off, and switches M2 and M3 are turned on, marking the transition to State 2. Current flows for State 2 are depicted FIG. 5B, and include a first current 502a circulating through the storage/recovery circuit components (i.e., inductor/inductance Ls, capacitor Cr, and auxiliary switch M3), and a second current 502b circulating through the buck stage components (i.e., buck inductor Lbuck, synchronous rectifier switch M2, and the load). Because of the energy stored in these components, these currents cannot change instantaneously. As a result, they circulate around the indicated paths. Because the respective currents through Ls and Lbuck are identical at the initiation of State 2, and because they flow in opposite directions through synchronous rectifier switch M2, the turn on event for synchronous rectifier switch M2 may be a zero current switching (ZCS) event, which can serve to reduce losses associated with this switching transition.

During State 2, energy stored in buck inductor Lbuck is delivered to the load (causing a decrease in buck inductor current 502b) as depicted in FIG. 6B. Also during State 2, energy stored in the inductor/inductance Ls is transferred to capacitor Cr by current 502a. More specifically, inductor/inductance Ls and capacitor Cr operate as a resonant circuit. As energy is transferred from the inductor/inductance to the capacitor, the voltage across the capacitor increases and the current through the inductor/inductance decreases. Once all of the energy has been transferred from inductor/inductance Ls to capacitor Cr, and the current through inductor/inductance Ls is zero, switch M3 may be turned off, initiating State 3, discussed below.

Before discussing State 3, it is useful to note that the timing of State 2 may be effectively self-regulating because of the resonant operation of inductor/inductance Ls and capacitor Cr. If more energy is stored in inductor/inductance Ls during State 1, then the higher current will shorten the time required to transfer the energy to capacitor Cr, and vice-versa. Thus the current reversal through inductor/inductance Ls may be a suitable event to trigger the turn off of switch M3. It will also be appreciated that even if the timing is slightly off, the residual energy stored in the capacitor will result adjust the duration of the subsequent switching cycle to effectively self-regulate. This self-regulation depends, at least in part, on appropriate selection of the inductance value for inductor/inductance Ls to store the required energy to achieve the soft switching transitions described herein while otherwise minimizing current through inductor/inductance Ls and therefore voltage swings of capacitor Cr. Finally, although the operation of the circuit is described in the case in which auxiliary switch M3 is actuated, the circuit will also operate if switch M3 is left off, in which case capacitor Cr is charged through the body diode of switch M3. However, conduction losses in such case would be higher because the body diode has a higher resistance than the turned-on channel.

Figure 5C:
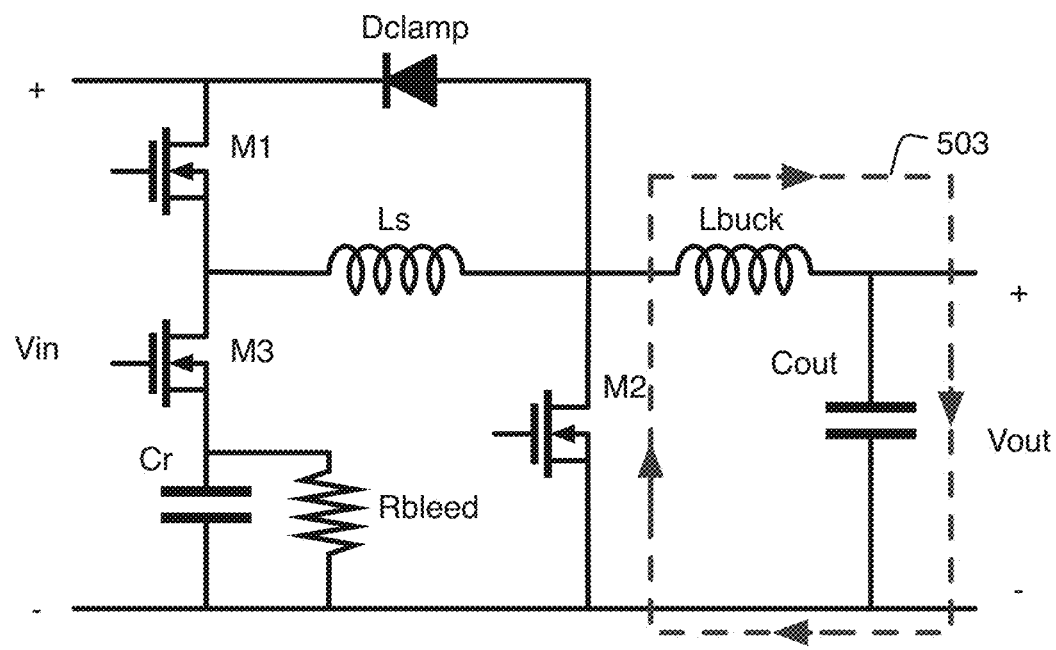

As noted above, the zero-crossing/reversal of current through inductor/inductance Ls may trigger the transition from switching State 2 to switching State 3. Current flow for State 3 is depicted in FIG. 5C. In switching state 3, auxiliary switch M3 is turned off, and synchronous rectifier switch M2 remains on. As a result, there is no current flow in the left side of the circuit, but energy stored in buck inductor Lbuck continues to be delivered to a load connected to the output via current 503. State 3 thus corresponds to the classical buck converter free-wheeling state, described above with respect to FIG. 1. Various waveforms for State 3 are illustrated in FIG. 6A, in which it can be seen that the current 503 through buck inductor Ls and synchronous rectifier switch continues to decrease as energy is delivered to the load.

Figure 5D:
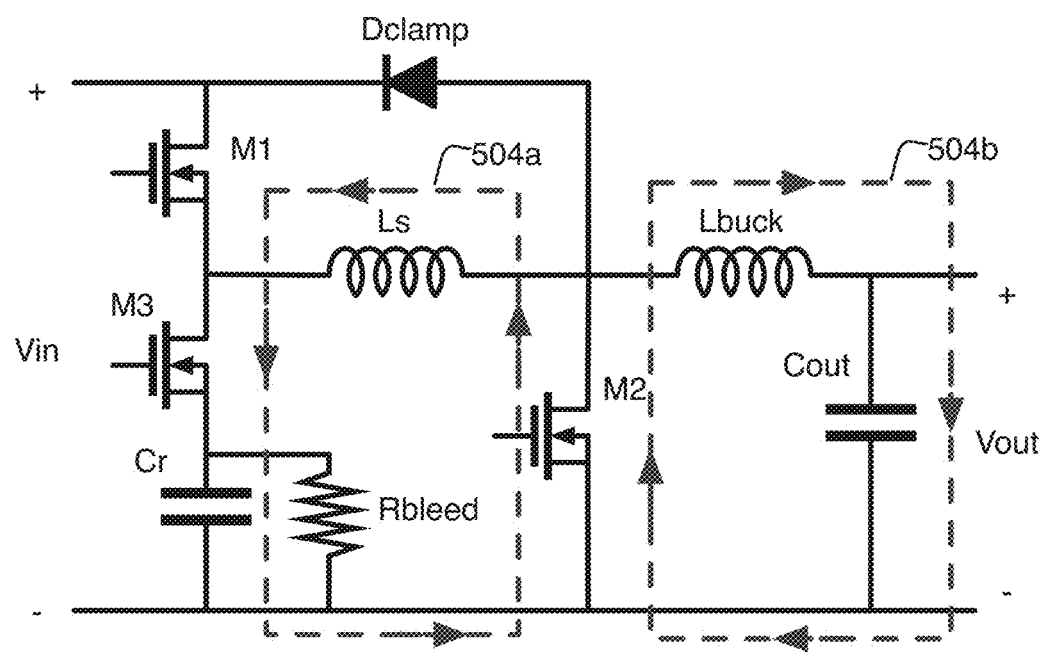

At a time determined by the controller, the transition from State 3 to State 4 may be initiated by turning auxiliary switch M3 back on. In some embodiments, the turn on of auxiliary switch M3 may be triggered by the current 503 through buck inductor Lbuck decreasing to a threshold. Alternatively, M3 turn-on may be predetermined by the buck controller, e.g., using duty-cycle control, as a quasi-constant time close to the timing of State 2. The double pulse control technique assumes that the two pulses are similar, so as to store and then extract about the same amount of energy from capacitor Cr. Current flows for State 4 are depicted in FIG. 5D. A first current 504a, begins to flow from capacitor Cr, through synchronous rectifier switch M2 (which remains turned on) through inductor/inductance Ls. This returns the energy stored in capacitor Cr back to inductor/inductance Ls, but in the opposite direction. This energy may subsequently be used to provide soft switching of main switch M1 and synchronous rectifier switch. Thus, the initiation of State 4 need to occur early enough to allow substantially all the energy to be returned to inductor/inductance Ls prior to the turn on of main switch M1 and turn off of synchronous rectifier switch. Various waveforms associated with State 4 are depicted in FIG. 6D, including current 504a through switch M3, current 504b through buck inductor Lbuck, and the sum of these currents flowing through synchronous rectifier switch M2 (604c).

Figure 5E:
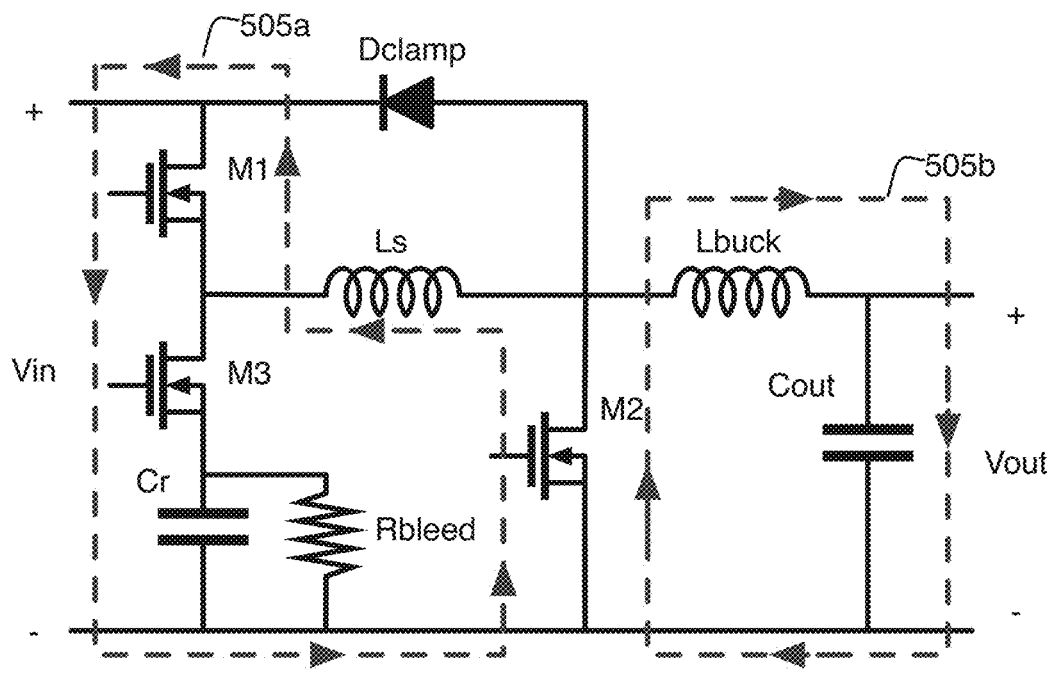

After substantially all the energy stored in capacitor Cr is returned to inductor/inductance Ls, switch M3 may be turned off again, marking the transition to switching State 5. Current flows associated with switching State 5 are illustrated in FIG. 5E, with various associated waveforms depicted in FIG. 6E1 and in enlarged view in FIG. 6E2. As illustrated in FIG. 5E, current 505a flowing through inductor/inductance Ls, which cannot change instantaneously upon turn-off of switch M3, now flows through the intrinsic body diode of turned off main switch M1, through the input, returning to inductor/inductance Ls via still turned-on synchronous rectifier switch M2. As can be seen in FIG. 6E1, the duration of State 5 is extremely short. It is just long enough to allow zero voltage switching (ZVS) turn-on of main switch M1, caused by the current flow through the intrinsic body diode of main switch M1, which forces the voltage across M1 to zero. This may be seen more clearly in FIG. 6E2, which expands the horizontal axis (i.e., the time associated with State 5) so that the various waveforms may be more clearly seen.

Also during State 5, synchronous rectifier switch M2 remains on, and current 505b continues to deliver energy stored in buck inductor to a load connected to the output.

Figure 5F:
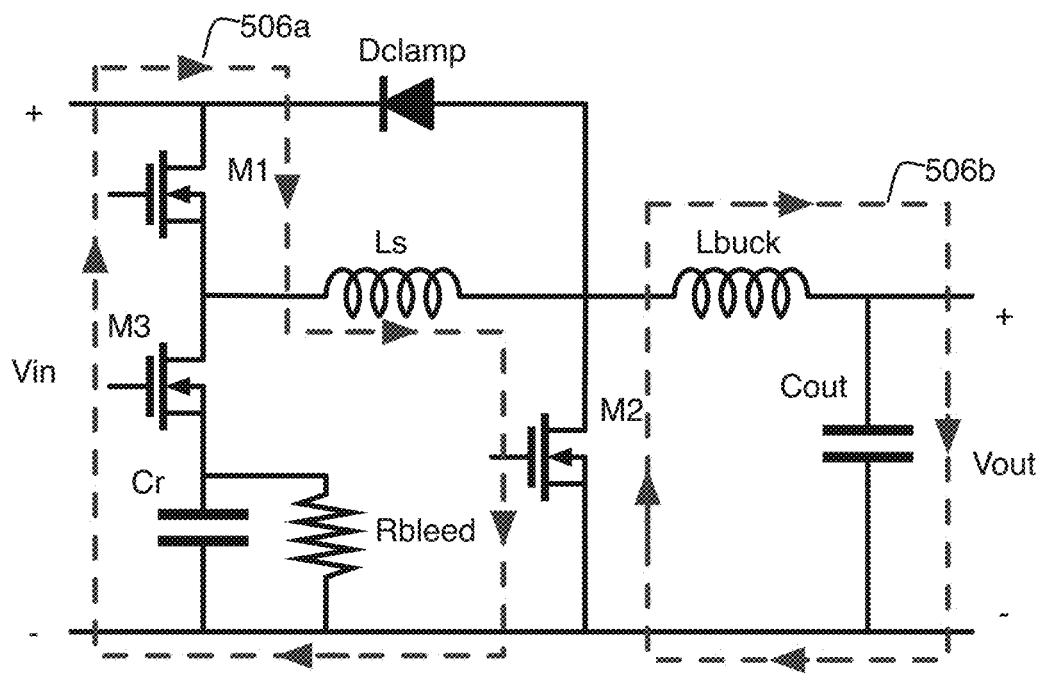

The ZVS turn-on of main switch M1 marks the transition to switching State 6. Current paths associated with State 6 are depicted in FIG. 5F, with various associated waveforms depicted in FIG. 6F1 and in enlarged view in FIG. 6F2. In State 6, main switch M1 is turned on, with synchronous rectifier switch M2 remaining on. In a conventional buck converter, like that discussed above with respect to FIG. 1, overlapping of the on-states of main switch M1 and synchronous rectifier switch M2 is avoided to prevent cross-conduction that effectively short circuits the input. However, the additional impedance presented by inductor/inductance Ls permits this brief overlap that allows for zero current switching (ZCS) turn-off of synchronous rectifier switch M2, further described below.

As illustrated in FIG. 5F, a first current 506a flows from the input, through inductor/inductance Ls, through still turned-on synchronous rectifier switch M2, back to the input. At the same time, current 506b continues to deliver energy stored in buck inductor Lbuck to a load connected to the output. Because of the small inductance value of inductor/inductance Ls, current 506a ramps up quickly, and thus rapidly equals in magnitude and offsets in direction the still decreasing buck inductor current 506b. At this moment the net current through switch M2 is zero. Synchronous rectifier switch M2 may thus be turned off under a zero current switching (ZCS) condition, reducing losses associated with synchronous rectifier operation.

As illustrated in FIG. 6F1, State 6 is also of extremely short duration; thus associated waveforms are also depicted in FIG. 6F2, in which the horizontal axis (time) has been expanded to more clearly show the associated waveforms. As can be seen in FIG. 6F2, State 6 sees the current 506a through inductor/inductance Ls decay to zero, meaning the energy previously stored therein has been used to achieve zero voltage turn on of main switch M1 (in State 5) and zero current turn off of synchronous rectifier switch (in State 6).

The turn-off of synchronous rectifier switch M2 marks the transition to switching State 7. Current flows associated with switching State 7 are illustrated in FIG. 5G, and associated waveforms are illustrated in FIG. 6G. As shown in FIG. 5G, current 507a now flows from the input, through main switch M1, inductor/inductance Ls, buck inductor Lbuck, and the load connected across the output. Additionally, any residual energy remaining in inductor Ls circulates through clamp diode Dclamp and switch M1 as the associated ringing damps out. The damping of this ringing then results in a transition back to State 1, which has the switches in the same states as State 7. As noted above, clamp diode Dclamp is optional, and, if not provided, State 7 may be omitted, with State 6 transitioning directly into State 1, discussed above.

FIG. 7 is a flowchart depicting the first control technique, i.e., a two-pulse control technique, for a three-switch buck converter as described above with reference to FIGS. 3-6G. Beginning in block 702, State 1 begins with the turn on of main switch M1 as described above. When the current through buck inductor Lbuck reaches its peak value Ipk (block 704), State 2 begins with the turn off of main switch M1 and turn on of synchronous rectifier switch M2 and auxiliary switch M3. As described above, the turn on of synchronous rectifier switch M2 is a zero current switching (ZCS) event. When current through inductor/inductance Ls reaches zero (by charging capacitor Cr, as described above), as determined in block 708, auxiliary switch M3 is turned off, ending the first pulse of the two-pulse control technique and beginning State 3 (block 710). Current through buck inductor continues to decay (because energy stored therein is being delivered to the load). When it reaches a predetermined threshold Ith (block 712), auxiliary switch M3 is turned on again, beginning the second pulse, and marking the transition to State 4 (block 714). In State 4, the energy stored in capacitor Cr is returned to inductor/inductance Ls. Once the capacitor voltage is zero (block 716), meaning all energy has been returned, auxiliary switch M3 is again turned off (block 718), marking the transition to State 5. This allows the main switch M1 to be turned on in a ZVS condition (block 720), beginning State 6. Once the current through synchronous rectifier switch M2 reaches zero, it may be opened in a ZCS switching event. Marking the transition to State 7 (in which any residual ringing is dissipated by circulating through optional clamp diode Dclamp). Alternatively, if clamp diode Dclamp is omitted, the transition is to State 1, which is also reached once the ringing circulating through Dclamp dies down.

Figure 8:
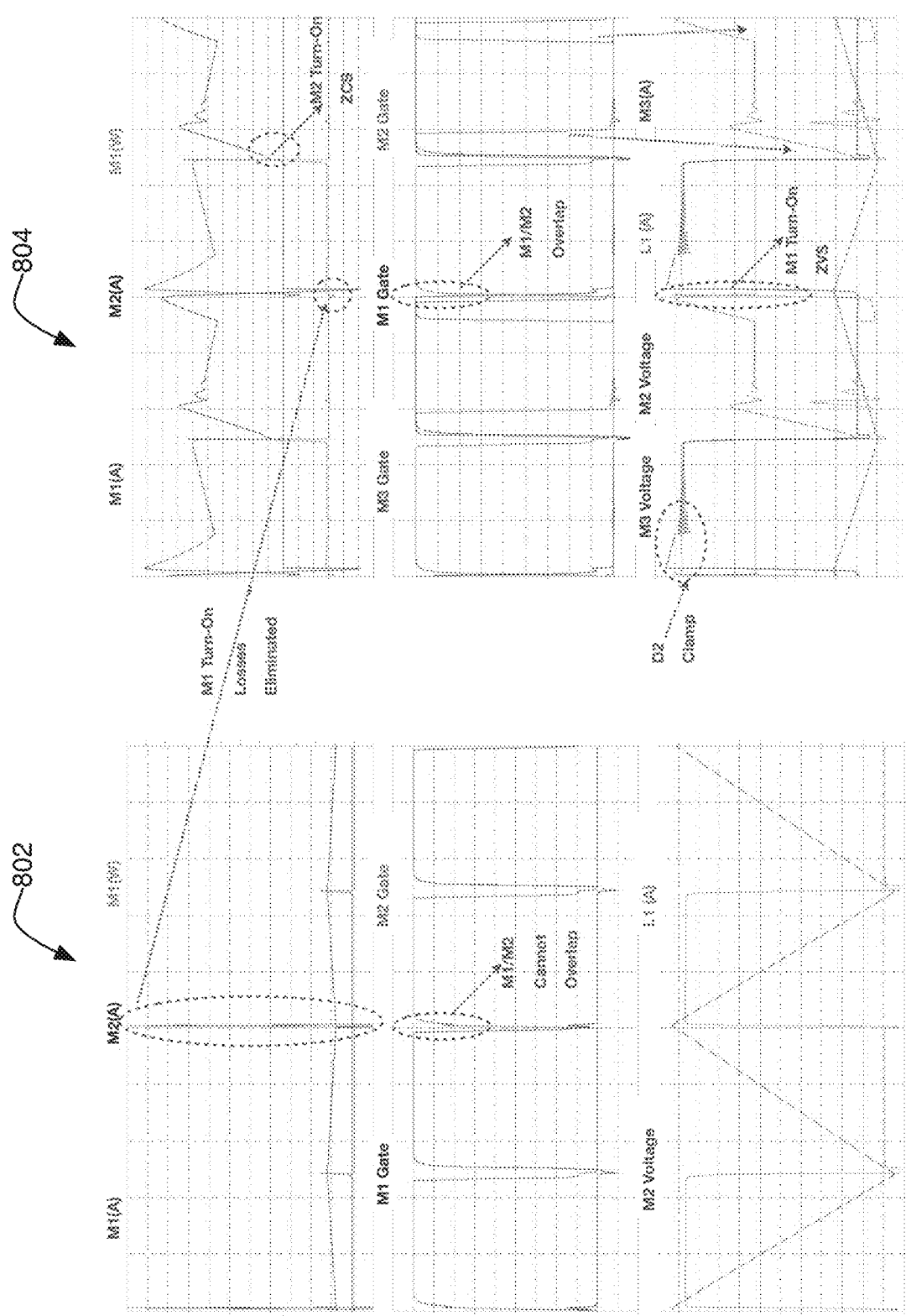
FIG. 8 depicts various waveforms of a conventional buck converter as illustrated in FIG. 1 vs. a three switch buck converter as illustrated in FIG. 3 operated according to a first control method as depicted in FIG. 7.

FIG. 8 illustrates waveform plots 802, associated with a conventional buck converter operating according to a conventional control cycle as described above with respect to FIG. 1. Traces include main switch current M2(A), synchronous rectifier switch current M2(A), main switch power loss M1(W), main switch gate voltage M1 Gate, synchronous rectifier switch gate voltage M2 Gate, synchronous rectifier drain to source voltage M2 Voltage, and buck inductor current L1(A). FIG. 8 also illustrates waveform plots 804, associated with a three switch buck converter as described above with reference to FIGS. 3-7. The same waveforms are depicted as in plot 802, as well as additional waveforms for the auxiliary switch gate voltage M3 Gate, auxiliary switch drain to source voltage M3 Voltage, and auxiliary switch current M3(A). (Note that these same waveforms are also depicted above in FIGS. 6A-6G.) Comparison of plots 802 and 804 shows various improvements and differences associated with three-switch buck converter controlled as described, including eliminating turn on losses associated with main switch M1, synchronous rectifier switch M2 turning on in a ZCS condition, the ability to overlap main switch M1 and synchronous rectifier switch M2, and the clamping effect of clamp diode Dclamp.

Second Control Mode—Delayed Synchronous Rectifier Switching

Figure 3:
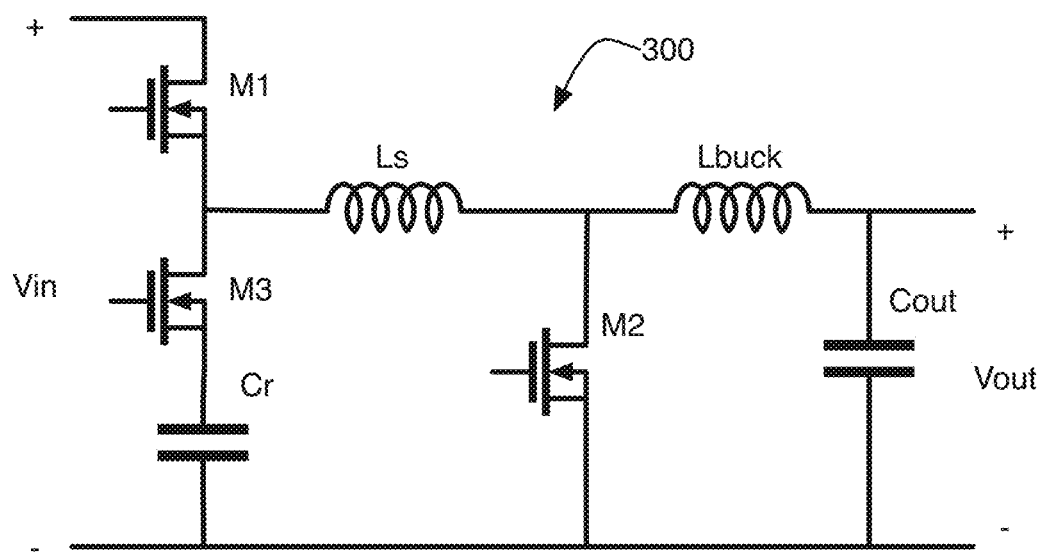
FIG. 3 depicts a schematic of a three switch buck converter.
Figure 4:
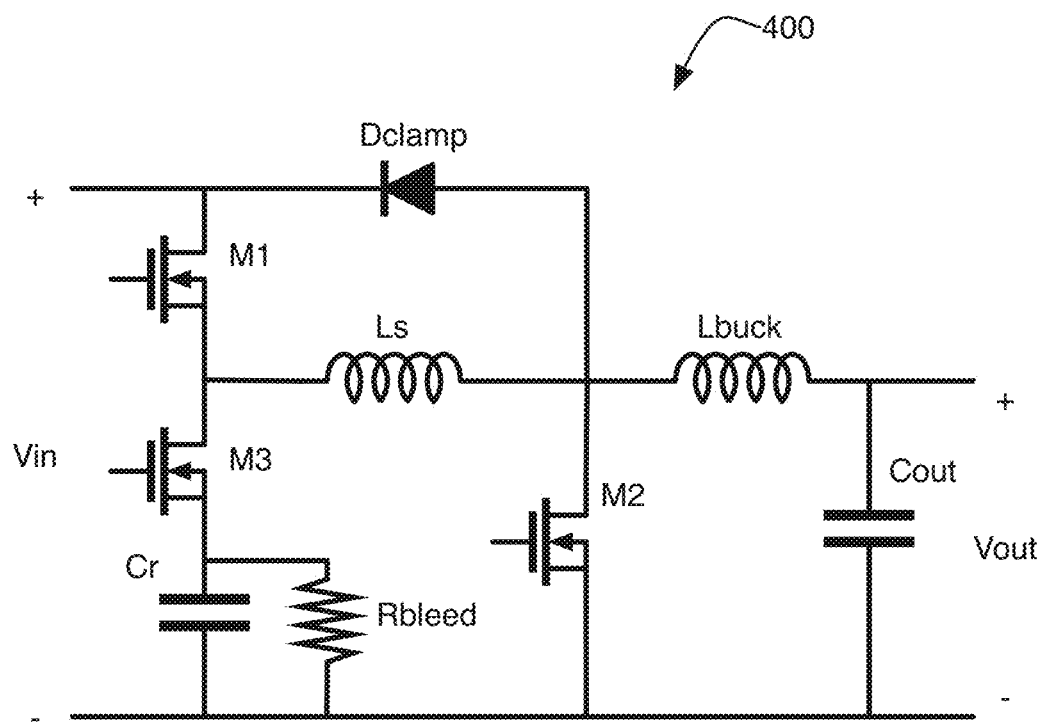
FIG. 4 depicts a schematic of a three switch buck converter.

As an alternative to the two-pulse control technique described above, the three switch buck converter depicted in FIGS. 3 and 4 may be controlled by a simpler second control mode illustrated as a flow chart in FIG. 9. In this alternative control mode, rather than the two pulses provided to auxiliary switch M3, a more conventional buck converter controller may be provided, with the synchronous rectifier drive output being coupled to the auxiliary switch M3 and also to synchronous rectifier switch M2 by a suitable delay. Many techniques for providing the required delay are known to those skilled in the art and are thus not repeated here.

Turning now to FIG. 9, the second delayed synchronous rectifier switching control mode is discussed in greater detail. State 1 begins with the turn on of main switch 902 in block 902. In block 904, the controller determines whether the buck inductor current has reached its peak value, in which case State 2 is entered by turning on main switch and turning on the auxiliary switch, which begins discharging energy stored in inductor/inductance Ls into capacitor Cr in a fashion similar to that described above with respect to FIGS. 5B and 6B. As noted above, auxiliary switch M3 may be controlled by the normal synchronous rectifier drive signal of a conventional buck converter controller, which may also be provided to synchronous rectifier switch M2 with a suitable fixed delay.

After that fixed delay 908, synchronous rectifier switch M2 may then be turned on, which is a zero current switching (ZCS) event, marking the transition to State 3. Then, after whatever condition is built into the conventional buck controller (for example the current through buck inductor Lbuck decaying to a predetermined threshold) the controller may turn off the auxiliary switch M3 (block 912) again using the normal synchronous rectifier switch control of the conventional buck controller. This commences the fixed delay before synchronous rectifier switch is also turned off. However, before this delay has completely elapsed, main switch M1 may be turned on (block 916) in a zero voltage switching event, similarly to the above description of the first controller. Thus, a first portion (Delay 1, block 914) of the fixed delay between turn off of the auxiliary switch M3 and the synchronous rectifier switch M2 occurs before turn on of main switch M1, and a second portion (Delay 2, block 918) occurs after the turn on of main switch M1. After the complete delay has elapsed, the controller may turn off synchronous rectifier switch M2 (block 920), commencing State 6, in which ring down may occur and then returning to State 1 described above.

Figure 10:
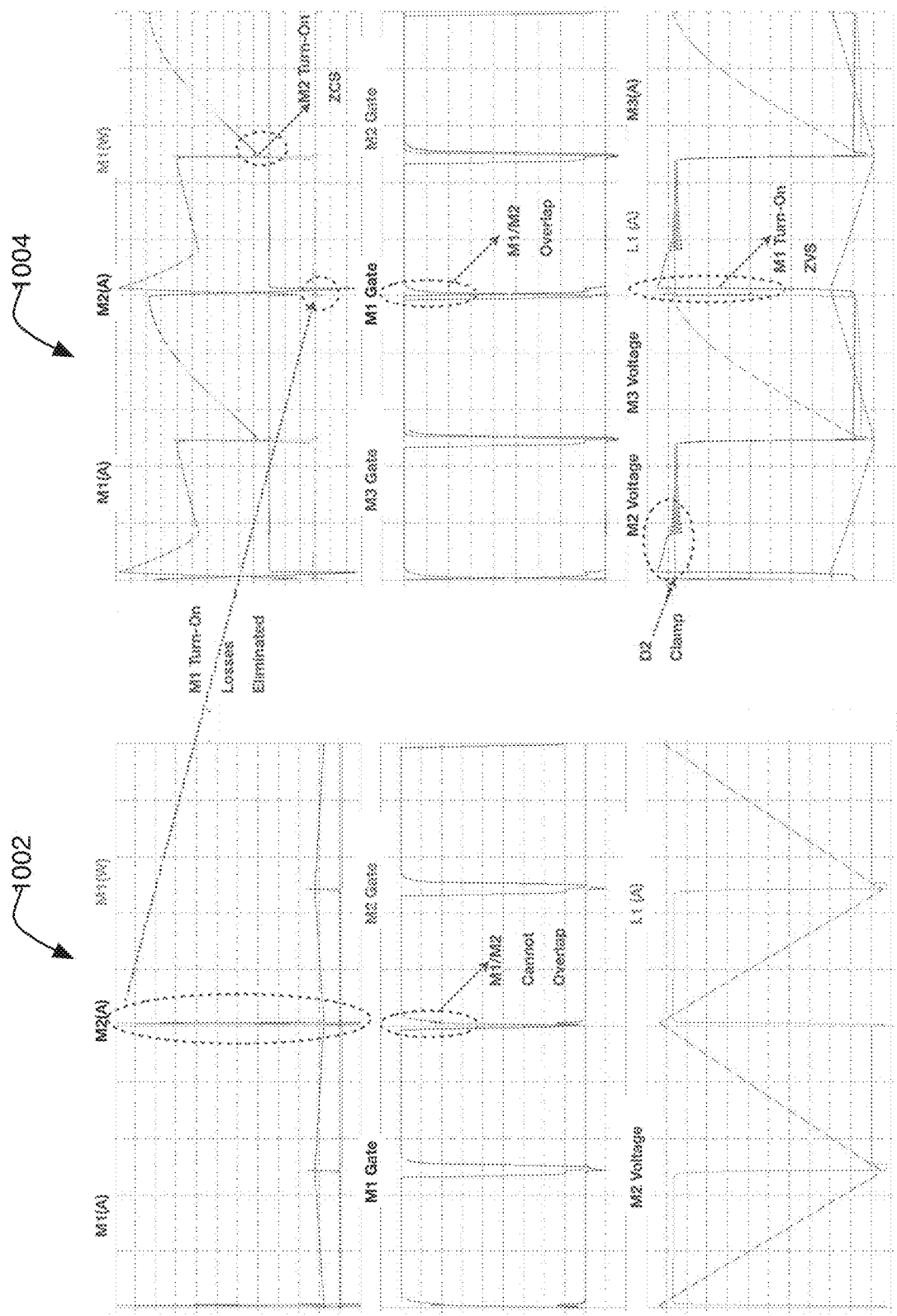
FIG. 10 depicts various waveforms of a conventional buck converter as illustrated in FIG. 1 vs. a three switch buck converter as illustrated in FIG. 3 operated according to a first control method as depicted in FIG. 9.

FIG. 10 illustrates various waveforms associated with the second control method. More specifically, as in FIG. 8, waveform plots 1002 are depicted, associated with a conventional buck converter operating according to a conventional control cycle as described above with respect to FIG. 1. Traces include main switch current M2(A), synchronous rectifier switch current M2(A), main switch power loss M1(W), main switch gate voltage M1 Gate, synchronous rectifier switch gate voltage M2 Gate, synchronous rectifier drain to source voltage M2 Voltage, and buck inductor current L1(A). FIG. 10 also illustrates waveform plots 1004, associated with a three switch buck converter as described above with reference to FIGS. 3-4 and 9. The same waveforms are depicted as in plot 1002, as well as additional waveforms for the auxiliary switch gate voltage M3 Gate, auxiliary switch drain to source voltage M3 Voltage, and auxiliary switch current M3(A). Comparison of plots 1002 and 1004 shows various improvements and differences associated with three-switch buck converter controlled as described, including eliminating turn on losses associated with main switch M1, synchronous rectifier switch M2 turning on in a ZCS condition, the ability to overlap main switch M1 and synchronous rectifier switch M2, and the clamping effect of clamp diode Dclamp.

As noted above, although the second control technique may be simpler to implement, because it can use a conventional buck converter controller with only the addition of an additional delay line for the synchronous rectifier switch control, it does not provide the same degree of efficiency improvement as the first control technique (i.e., the two-pulse control technique) described above. Depending on the requirements of a particular embodiment, either control technique may be used with the topology depicted in FIG. 3 or 4 (or equivalent variations).

Either of the above described control modes may be implemented by any of a variety of control circuits, which may be coupled to appropriate sensors to detect control variables (such as voltages and currents associated with the various components) and may also be coupled to driver circuits for the various switching devices. In some embodiments, the switching devices and the controller may be implemented as a single integrated circuit. In other embodiments, the controller may be separate from one or more of the switching devices. The controller may be any combination of analog, digital, discrete, or integrated circuitry that is configured to operate as described. In some embodiments, the controller may be implemented as a programmable logic device, such as a microcontroller or other suitable device.

The foregoing description particularly relates to a buck converter in which an added auxiliary switch, inductor/inductance, and resonant capacitor are provided to recover "parasitic" losses and use these losses to provide for reduced switching losses of the main switch and synchronous rectifier switch. However, it will be appreciated by those skilled in the art that the same principles and techniques may be applied to boost converters, buck-boost converters, and other similar converter types.

The foregoing describes exemplary embodiments of switching converters with reduced switching losses. Such systems may be used in a variety of applications but may be particularly advantageous when used in conjunction with charging circuits and other power supply circuits in portable electronic devices. Additionally, although numerous specific features and various embodiments have been described, it is to be understood that, unless otherwise noted as being mutually exclusive, the various features and embodiments may be combined various permutations in a particular implementation. Thus, the various embodiments described above are provided by way of illustration only and should not be constructed to limit the scope of the disclosure. Various modifications and changes can be made to the principles and embodiments herein without departing from the scope of the disclosure and without departing from the scope of the claims.

The invention claimed is:

1. A DC-DC power converter having an input configured to receive an input voltage from a source and an output configured to deliver an output voltage to a load, the power converter comprising:

at least one magnetic energy storage element;

a main switching device configured to alternate between switching states to selectively store energy from the input in the magnetic energy storage element;

a synchronous rectifier switching device configured to alternate between switching states to selectively deliver energy from the magnetic energy storage element to the output; and an energy recovery circuit comprising a resonant circuit having an inductance and a capacitor and an auxiliary switching device configured to operate in conjunction with the main switching device and the synchronous rectifier switching device so as to alternately store energy in the resonant circuit and deliver energy from the resonant circuit to reduce switching losses associated with the main switching device and the synchronous rectifier switching device;

wherein:

the main switching device, the inductance, and the magnetic energy storage element form a series path from the input to the output;

the synchronous rectifier switching device has a first terminal coupled to a junction between the inductance and the magnetic energy storage element; and the auxiliary switching device and capacitor are coupled in series between a junction of the main switch and the inductance and a second terminal of the synchronous rectifier switch.

2. The power converter of claim 1 wherein the converter is a buck converter.

3. The power converter of claim 1 further comprising a clamp diode coupled across the main switching device and the inductance.

4. The power converter of claim 2 wherein the auxiliary switching device is operated according to a two-pulse control mode.

5. The power converter of claim 4 wherein the two-pulse control mode comprises:
turning on the main switching device, thereby storing energy in the magnetic energy storage element and an inductance of the resonant circuit;
responsive to a current through the magnetic energy storage element reaching a threshold, turning off the main switching device and turning on the auxiliary switching device and the synchronous rectifier switching device, wherein energy stored in the inductance of the resonant circuit allows zero current switching of the synchronous rectifier switch;
responsive to a current through the inductance reaching zero, turning off the auxiliary switching device, ending a first pulse, thereby transferring energy stored in the inductance of the resonant circuit to a capacitor of the resonant circuit;
turning the auxiliary switching device back on, beginning a second pulse, thereby transferring energy stored in the capacitor of the resonant circuit back to the inductance;
turning off the auxiliary switching device, ending the second pulse;
turning on the main switching device in a zero voltage condition as a result of energy stored the inductance; and
turning off the synchronous rectifier switching device subsequent to the turn on of the main switching device, wherein turn off of the synchronous rectifier switching device is a zero current switching event as a result of energy stored in the inductance.

6. The power converter of claim 1 wherein the auxiliary switching device is operated using a synchronous rectifier control output of a buck converter controller and wherein the synchronous rectifier switching device is operated using the synchronous rectifier control output of the buck converter controller with a predetermined delay.

7. The power converter of claim 1 wherein the magnetic energy storage element is an inductor.

8. The power converter of claim 1 wherein the inductance is a parasitic inductance.

9. The power converter of claim 8 wherein the parasitic inductance is a parasitic inductance of a PCB trace.

10. The power converter of claim 8 wherein the parasitic inductance is designed to provide a desired inductance value, the desired inductance value being selected to provide sufficient energy to achieve reduced switching devices of the main switching device and the auxiliary switching device without circulating excess energy in the circuit.

11. A two-pulse control method for a DC-DC power converter, the power converter having a magnetic energy storage element, a main switching device, a synchronous rectifier switching device, and an energy recovery circuit including a resonant circuit and an auxiliary switching device, the method comprising:
turning on the main switching device, thereby storing energy in the magnetic energy storage element and an inductance of the resonant circuit;
responsive to a current through the magnetic energy storage element reaching a threshold, turning off the main switching device and turning on the auxiliary switching device and the synchronous rectifier switching device, wherein energy stored in the inductance of the resonant circuit allows zero current switching of the synchronous rectifier switch;
responsive to a current through the inductance reaching zero, turning off the auxiliary switching device, ending a first pulse, thereby transferring energy stored in the inductance of the resonant circuit to a capacitor of the resonant circuit; and
turning the auxiliary switching device back on, beginning a second pulse, thereby transferring energy stored in the capacitor of the resonant circuit back to the inductance.

12. The method of claim 11 wherein turning the auxiliary switching device back on is responsive to a current through the magnetic storage element reaching a threshold.

13. The method of claim 11 further comprising turning off the auxiliary switching device, ending the second pulse.

14. The method of claim 13 wherein turning off the auxiliary switching device is responsive to a voltage across the capacitor reaching zero.

15. The method of claim 13 further comprising turning on the main switching device in a zero voltage condition as a result of energy stored the inductance.

16. The method of claim 15 further comprising turning off the synchronous rectifier switching device subsequent to the turn on of the main switching device, wherein turn off of the synchronous rectifier switching device is a zero current switching event as a result of energy stored in the inductance.

17. A control method for a DC-DC power converter, the power converter having a magnetic energy storage element, a main switching device, a synchronous rectifier switching device, and an energy recovery circuit including a resonant circuit and an auxiliary switching device, the method comprising:
turning on the main switching device, thereby storing energy in the magnetic energy storage element and an inductance of the resonant circuit;
responsive to a current through the magnetic energy storage element reaching a threshold, turning off the main switching device and turning on the auxiliary switching device, thereby beginning transfer of energy stored in the inductance to a capacitor of the resonant circuit;
after a first delay, turning on the synchronous rectifier switching device in a zero current switching condition as a result of energy stored in the inductance of the resonant circuit;
turning off the auxiliary switching device commencing a second delay period;
during the second delay period, turning on the main switching device in zero voltage condition as a result of energy stored in the resonant circuit; and
at the end of the second delay period, turning off the synchronous rectifier switch.

\* \* \* \* \*